US011688443B2

(12) United States Patent
Lee

(10) Patent No.: US 11,688,443 B2
(45) Date of Patent: Jun. 27, 2023

(54) SEMICONDUCTOR DEVICE

(71) Applicant: SK hynix Inc., Gyeonggi-do (KR)

(72) Inventor: Dong Uk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 25 days.

(21) Appl. No.: 17/569,222

(22) Filed: Jan. 5, 2022

(65) Prior Publication Data
US 2023/0082703 A1 Mar. 16, 2023

(30) Foreign Application Priority Data

Sep. 10, 2021 (KR) ........................ 10-2021-0120934

(51) Int. Cl.
*H03K 5/133* (2014.01)
*G11C 7/22* (2006.01)
*H01L 25/065* (2023.01)
*H01L 25/18* (2023.01)

(52) U.S. Cl.
CPC .......... *G11C 7/222* (2013.01); *H01L 25/0657* (2013.01); *H03K 5/133* (2013.01); *G11C 2207/2254* (2013.01); *H01L 25/18* (2013.01); *H01L 2225/06541* (2013.01)

(58) Field of Classification Search
None
See application file for complete search history.

(56) References Cited

U.S. PATENT DOCUMENTS

| 9,659,628 | B2 | 5/2017 | Stephens, Jr. | |
|---|---|---|---|---|
| 2014/0104935 | A1* | 4/2014 | Ware | G11C 7/106 365/233.13 |
| 2018/0286467 | A1* | 10/2018 | Arai | G11C 11/4093 |
| 2020/0302979 | A1* | 9/2020 | Kim | G11C 29/028 |

FOREIGN PATENT DOCUMENTS

KR 10-1857677 B1 5/2018

* cited by examiner

*Primary Examiner* — Cassandra F Cox
(74) *Attorney, Agent, or Firm* — IP & T Group LLP

(57) ABSTRACT

A semiconductor device includes: a first transfer path outputting a first preliminary signal; a second transfer path outputting a second preliminary signal; a third transfer path outputting a third preliminary signal; a first calibration circuit generating a first calibration code corresponding to a difference in delay values between the first transfer path and a selected transfer path having a largest delay value among the first to third transfer paths; a second calibration circuit generating a second calibration code corresponding to a difference in delay values between the second transfer path and the selected transfer path; a third calibration circuit generating a third calibration code corresponding to a difference in delay values between the third transfer path and the selected transfer path; a first delay control circuit generating a first signal; a second delay control circuit generating a second signal; and a third delay control circuit generating a third signal.

17 Claims, 13 Drawing Sheets

| OUT | CID_x<1:0> | | |
|---|---|---|---|
| | 00 @ 112_0 | 01 @ 112_1 | 10 @ 112_2 |
| STR | SDQ0_0 | SDQ1_1 | SDQ2_2 |
| DS0 | SDQ1_0 | SDQ2_1 | SDQ0_2 |
| DS1 | SDQ2_0 | SDQ0_1 | SDQ1_2 |

FIG. 13

| TOUT | | | | | | | | | CAL_CODE_x | | | |
|---|---|---|---|---|---|---|---|---|---|---|---|---|
| <0> | <1> | <2> | <3> | <4> | <5> | <6> | <7> | | <0> | <1> | <2> | <3> |
| 1 | 1 | 1 | 1 | 1 | 1 | 1 | 1 | | 0 | 0 | 0 | 0 |
| 0 | 1 | 1 | 1 | 1 | 1 | 1 | 1 | | 1 | 0 | 0 | 0 |
| 0 | 0 | 1 | 1 | 1 | 1 | 1 | 1 | | 0 | 1 | 0 | 0 |
| 0 | 0 | 0 | 1 | 1 | 1 | 1 | 1 | | 1 | 1 | 0 | 0 |
| 0 | 0 | 0 | 0 | 1 | 1 | 1 | 1 | | 0 | 0 | 1 | 0 |
| 0 | 0 | 0 | 0 | 0 | 1 | 1 | 1 | | 1 | 0 | 1 | 0 |
| 0 | 0 | 0 | 0 | 0 | 0 | 1 | 1 | | 0 | 1 | 1 | 0 |
| 0 | 0 | 0 | 0 | 0 | 0 | 0 | 1 | | 1 | 1 | 1 | 0 |
| 0 | 0 | 0 | 0 | 0 | 0 | 0 | 0 | | 0 | 0 | 0 | 1 |

SEMICONDUCTOR DEVICE

CROSS-REFERENCE TO RELATED APPLICATIONS

The present application claims priority to Korean Patent Application No. 10-2021-0120934, filed on Sep. 10, 2021, which is incorporated herein by reference in its entirety.

BACKGROUND

1. Field

Various embodiments of the present invention relate to a semiconductor designing technology, and more particularly, to a method for correcting a delay time difference among a plurality of chips.

2. Description of the Related Art

As semiconductor memory technology makes drastic progress, packaging technology of semiconductor devices is also required to have high integration and high performance. Accordingly, techniques for three-dimensional structures for vertically stacking a plurality of integrated circuit chips, other than a two-dimensional structure in which integrated circuit chips are planarly arranged on a printed circuit board (PCB) by using wires or bumps, are being developed diversely.

This three-dimensional structure may be realized in the form of a stacked memory device where a plurality of memory chips are vertically stacked. The memory chips stacked in the vertical direction are electrically connected to each other through a through silicon via (TSV), and mounted on a substrate for a semiconductor package.

Recently, memory devices including a plurality of stacked memory chips are being widely used. The stacked memory chips have such operation characteristics as different delay values due to process variations among the stacked memory chips. A technique for reducing process variations among stacked memory chips is very important because problems such as insufficient margins and a drop in speed of a memory device may occur due to the difference in the operation characteristics between the memory chips.

SUMMARY

Embodiments of the present invention are directed to a technology for reducing process variations among a plurality of chips.

The technical effects desired to be achieved in the embodiments of the present invention are not limited to the technical effects mentioned above, and other technical effects not mentioned above may also be clearly understood by those of ordinary skill in the art to which the present invention pertains from the description below.

In accordance with an embodiment of the present invention, a semiconductor device includes: a first transfer path outputting a first preliminary signal; a second transfer path outputting a second preliminary signal; a third transfer path outputting a third preliminary signal; a first calibration circuit generating a first calibration code corresponding to a difference in delay values between the first transfer path and a selected transfer path having a largest delay value among the first to third transfer paths; a second calibration circuit generating a second calibration code corresponding to a difference in delay values between the second transfer path and the selected transfer path; a third calibration circuit generating a third calibration code corresponding to a difference in delay values between the third transfer path and the selected transfer path; a first delay control circuit generating a first signal; a second delay control circuit generating a second signal; and a third delay control circuit generating a third signal.

In accordance with another embodiment of the present invention, a semiconductor device includes a plurality of stacked chips, to which different chip IDs are set, each chip including: a transfer path suitable for transferring a source signal, which is transferred through a first normal through-electrode, and outputting a preliminary signal; a delay control circuit suitable for generating an internal strobe signal by delaying the preliminary signal with a delay value which is determined based on a calibration code; a replica circuit suitable for simulating a delay value of the transfer path and generating a test signal by delaying a test source signal which is transferred through a first test through-electrode; a driving circuit suitable for transferring the generated test signal to a second test through-electrode corresponding to a chip ID among second test through-electrodes; and a calibration circuit suitable for generating the calibration code based on the generated test signal and test signals transferred from the other chips through the second test through-electrodes.

In accordance with another embodiment of the present invention, a semiconductor device includes: stacked chips each including: an operation circuit configured to receive a source signal through a normal through-electrode to generate an internal strobe signal by delaying the source signal by a calibrated amount that depends on a calibration code; a replica circuit configured to generate a test signal by delaying a test source signal, which is provided through a first test through-electrode, by an amount representing a delay other than the calibrated amount within the operation circuit; a driving circuit configured to provide the test signal to remaining chips through a corresponding one of second test through-electrodes; and a calibration circuit configured to generate the calibration code by detecting respective delay amounts of external test signals, which are respectively provided from the remaining chips through remaining second test through-electrodes, with reference to the test signal.

BRIEF DESCRIPTION OF THE DRAWINGS

FIG. 13 is a table for describing an operation of an encoding circuit shown in FIG. 11 in accordance with an embodiment of the present invention.

DETAILED DESCRIPTION

Figure 1:
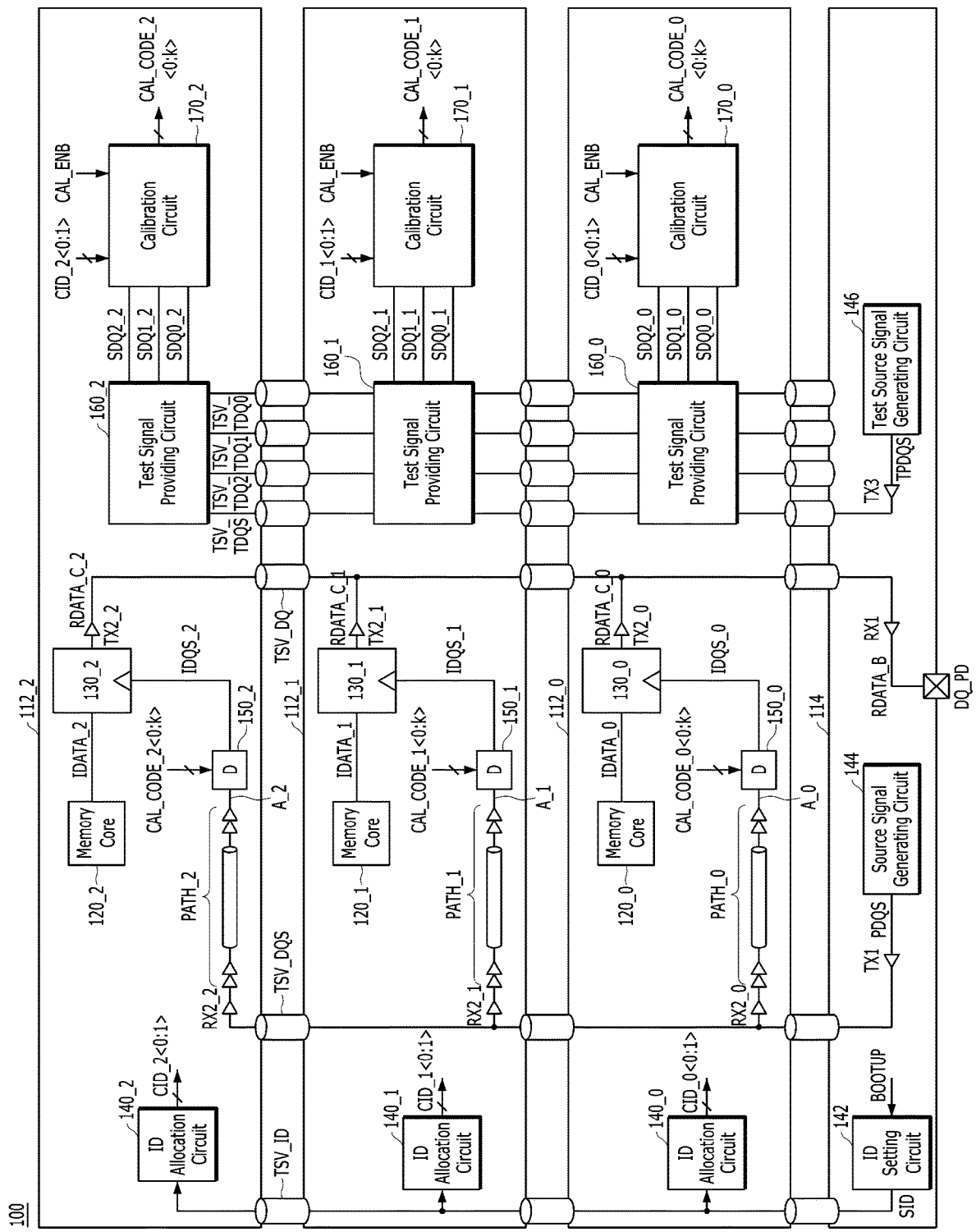
FIG. 1 is a block diagram illustrating a semiconductor device 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 1 is a block diagram illustrating a semiconductor device 100 in accordance with an embodiment of the present invention.

Referring to FIG. 1, the semiconductor device 100 may include a plurality of stacked chips 114, 112_0, 112_1, and 112_2 and through-electrodes TSV_ID, TSV_DQS, TSV_DQ, TSV_TDQS, TSV_TDQ0, TSV_TDQ1, and TSV_TDQ2 for transferring signals among the stacked chips 114, 112_0, 112_1 and 112_2.

A lower chip 114 may be a chip serving as an interface. Such a chip may also be referred to as a base die. The chips 112_0 to 112_2 may be memory chips for storing data. The chips 112_0 to 112_2 may communicate with other chips outside the semiconductor device 100 (e.g., a processor including a memory controller such as a CPU, GPU, or AP) through the chip 114. The chips 112_0 to 112_2 may also be referred to as a core die.

The chip 114 may include transferors TX1 and TX3, a receiver RX1, an identifier (ID) setting circuit 142, a source signal generating circuit 144, and a test source signal generating circuit 146.

The source signal generating circuit 144 of the chip 114 may generate a source signal PDQS to be used as a strobe signal in each of the chips 112_0, 112_1, and 112_2 based on a clock signal transferred from the outside of the semiconductor device 100 or generated inside the chip 114. The transferor TX1 may transfer the source signal PDQS to the chips 112_0, 112_1, and 112_2 through the first normal through-electrode TSV_DQS.

The receiver RX1 of the chip 114 may receive the signal transferred through the second normal through-electrode TSV_DQ (i.e., the read data RDATA_C_0, RDATA_C_1, and RDATA_C_2 transferred from the chips 112_0 to 112_2, and generate read data RDATA_B. The read data RDATA_B may be output to the outside of the semiconductor device 100 through an input/output pad DQ_PD. Although it is illustrated in FIG. 1 that there is one second normal through-electrode TSV_DQ and one receiver TX1, there may be a plurality of the second normal through-electrodes TSV_DQ and a plurality of the receivers TX1. For example, multi-bit read data RDATA_C_0 may be transferred from the chip 112_0 through a plurality of the second normal through-electrodes TSV_DQ, and a plurality of the receivers RX1 may receive multi-bit parallel data RDATA_C_0, and a parallel-to-serial converting circuit (not shown) may perform a parallel-to-serial conversion to generate serial data RDATA_B. The serial data RDATA_B may be output to the outside of the semiconductor device 100 through the input/output pad DQ_PD.

The test source signal generating circuit 146 of the chip 114 may generate a test source signal TPDQS which is used for a calibration operation to compensate for process variation between the chips 160_0, 160_1, and 160_2, and the transferor TX3 may transfer the test source signal TPDQS to the chips 112_0, 112_1, and 112_2 through the first test through-electrode TSV_TDQS. The calibration operation may be performed when the semiconductor device 100 is initialized.

The ID setting circuit 142 of the chip 114 may generate an initial ID SID in response to an initialization signal BOOTUP of the semiconductor device 100 and transfer it to the third normal through-electrode TSV_ID.

The chips 112_0, 112_1, 112_2 may include memory cores 120_0, 120_1 and 120_2, data output circuits 130_0, 130_1 and 130_2, receivers RX2_0, RX2_1 and RX2_2, paths PATH_0, PATH_1 and PATH_2, delay control circuits 150_0, 150_1 and 150_2, test signal providing circuits 160_0, 160_1 and 160_2, and calibration circuits 170_0, 170_1 and 170_2, respectively.

Since the chips 112_0, 112_1, and 112_2 have the same structure, the structure of the chips 112_0, 112_1 and 112_2 may be described by describing the chip 112_2.

The memory core 120_2 may be provided to store data. The memory core 120_2 may include a plurality of row lines (word lines), a plurality of column lines (bit lines), a plurality of memory cells that are formed at intersections between the row lines and column lines, and circuits for reading/writing data of the memory cells.

The receiver RX2_2 may receive the source signal PDQS transferred by the transferor TX1 to the first normal through-electrode TSV_DQS. The path PATH_2 may represent a path through which the source signal received by the receiver RX2_2 is used and transferred in the inside of the chip 112_2. The path PATH_2 may include a plurality of buffers for transferring the source signal in the chip 112_2 and conductive lines between the buffers. The source signal may be transferred through the path PATH_2 and experience delay. A preliminary signal A_2 may be obtained as the source signal is delayed through the path PATH_2.

Different chips 112_0, 112_1 and 112_2 may have different process variations. Accordingly, the paths PATH_0, PATH_1 and PATH_2 of the chips 112_0, 112_1 and 112_2 may all have different delay values. The delay value difference between the source signal PDQS and the preliminary signal A_0, the delay value difference between the source signal PDQS and a preliminary signal A_1, and the delay value difference between the source signal PDQS and the preliminary signal A_2 may be all different. Since the preliminary signals A_0, A_1 and A_2 are signals for generating a strobe signal for outputting the data of the chips, when the delay values of the preliminary signals A_0, A_1 and A_2 are different from each other, the data output timing may vary according to which chip among the chips 112_0, 112_1 and 112_2 outputs data. For example, when the data RDATA_C_0 is output from the chip 112_0, the data RDATA_C_0 may be transferred to the chip 114 at an early timing, and when the data RDATA_C_1 is output from the chip 112_1, the data RDATA_C_1 may be output to the chip 114 at an intermediate timing. When the data RDATA_C_2 is output from the chip 112_2, the data RDATA_C_2 may be transferred to the chip 114 at a slow timing. When the operation timing is different according to which chip among the stacked chips 112_0, 112_1 and 112_2 performs the same operation, the operation may be inconsistent, thus causing such issues as insufficient margin and speed decrease of the semiconductor device 100.

The delay control circuit 150_2 may generate an internal strobe signal IDQS_2 by delaying the preliminary signal A_2 with the delay value determined based on the calibration code CAL_CODE_2<0:k>. The delay control circuit 150_2 may be a circuit for compensating for a delay value difference between the paths PATH_0, PATH_1 and PATH_2 of the chips 112_0, 112_1 and 112_2.

The calibration codes CAL_CODE_0<0:k>, CAL_CODE_1<0:k>, and CAL_CODE_2<0:k> for each of the chips 112_0, 112_1 and 112_2 may be generated in different values, and accordingly since the delay values of the delay control circuits 150_0, 150_1 and 150_2 are also set differently, the difference in the delay values of the paths PATH_0, PATH_1 and PATH_2 may be compensated. As the result of the calibration of the individual delay values of the delay control circuits 150_0 to 150_2 through the calibration codes CAL_CODE_0<0:k>, CAL_CODE_1<0:k>, and CAL_CODE_2<0:k>, the following relationship may be made: the sum of the delay value of the path PATH_0 of the chip 112_0 and the delay value of the delay control circuit 150_0=the sum of the delay value of the path PATH_1 of the chip 112_1 and the delay value of the delay control circuit 150_1=the sum of the delay value of the path PATH_2 of the chip 112_2 and the delay value of the delay control circuit 150_2. As a result, the delay values that the respective chips 112_0, 112_1, and 112_2 intentionally and unintentionally experience in the course of generating the internal strobe signals IDQS_0, IDQS_1 and IDQS_2 from the source signal PDQS may be the same.

The calibration circuit 170_2 may generate a calibration code CAL_CODE_2<0:k> based on the signals SDQ0_2, SDQ1_2 and SDQ2_2 that are provided from the test signal providing circuit 160_2. The calibration circuit 170_2 may generate the calibration code CAL_CODE_2<0:k> corresponding to the delay value difference between the transfer path having the largest delay value among the transfer paths PATH_0, PATH_1 and PATH_2 and the transfer path PATH_2.

When the delay value of the transfer path PATH_0 is X and the delay value of the transfer path PATH_1 is Y and the delay value of the transfer path PATH_2 is Z, and Y is the largest among X, Y, and Z, the calibration code CAL_CODE_0<0:k> may be generated to correspond to the difference between the delay values Y and X. Similarly, the calibration code CAL_CODE_1<0:k> may be generated to correspond to the difference between the delay values Y and Y, and the calibration code CAL_CODE_2<0:k> may be generated to correspond to the difference between the delay values Z and Y.

The test signal providing circuit 160_2 may provide the signals SDQ0_2, SDQ1_2 and SDQ2_2 required for generating the calibration code CAL_CODE_2<0:k> of the calibration circuit 170_2. The detailed structure and operation of the test signal providing circuit 160_2 will be described in detail with reference to FIG. 2.

An ID allocation circuit 140_2 may generate a chip ID CID_2<0:1> based on the initial ID SID transferred through the third normal through-electrode TSV_ID. The chip ID CID_2<0:1> may be an ID for distinguishing the chips 112_0, 112_1 and 112_2 from each other.

The ID allocation circuits 140_0, 140_1 and 140_2 of the chips 112_0, 112_1 and 112_2 may generate different chip IDs CID_0<0:1>, CID_1<0:1>, and CID_2<0:1>. The ID allocation circuits 140_0, 140_1 and 140_2 may generate sequentially increasing chip IDs CID_0<0:1>, CID_1<0:1>, and CID_2<0:1> based on the initial ID SID which is transferred through the third normal through-electrode. For example, the chip 112_0 may generate the chip ID CID_0<0:1> of '00' based on the initial ID SID, and the chip 112_1 may generate the chip ID CID_1<0:1> of '01' by increasing the initial ID SID by +1. The chip 112_2 may generate the chip ID CID_2<0:1> of '10' by increasing the initial ID SID by +2.

Although it is illustrated in FIG. 1 that the three chips 112_0, 112_1, and 112_2 are stacked over the chip 114 which is used as an interface, it would be apparent to those skilled in the art that the number of the chips may be different from this. For example, 4 or 8 chips may be stacked over the chip 114. Also, the present invention which is suggested to compensate for different process variations between the chips may be applied not only to a semiconductor device including stacked chips, but also to a semiconductor device including a plurality of chips that are laterally formed, e.g., a chiplet structure.

Figure 2:
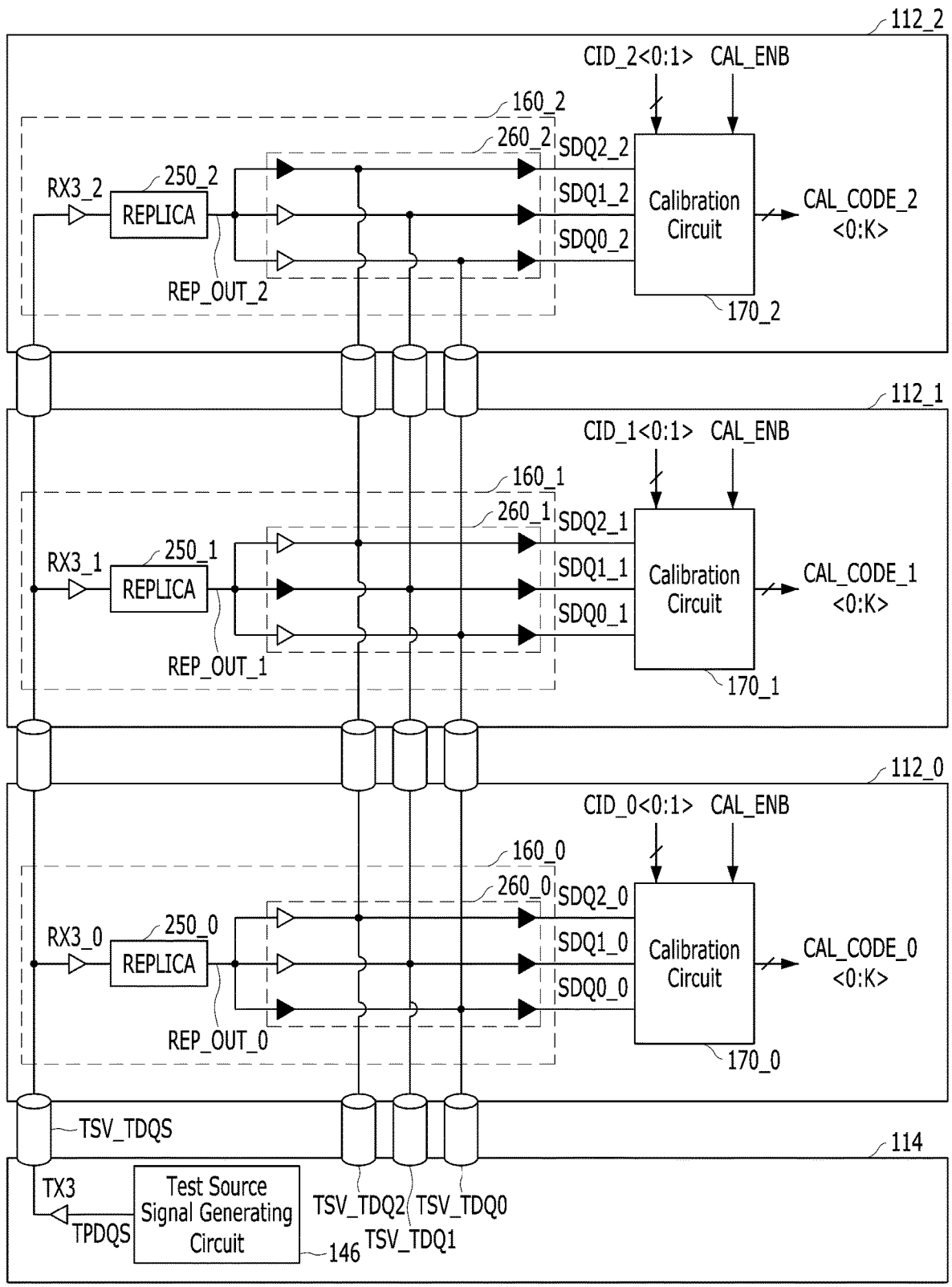
FIG. 2 is a detailed block diagram illustrating structures related to generation of calibration codes shown in FIG. 1 in accordance with an embodiment of the present invention.

FIG. 2 is a block diagram illustrating structures related to generation of the calibration codes CAL_CODE_0<0:k>, CAL_CODE_1<0:k>, and CAL_CODE_2<0:k> which are shown in FIG. 1 in detail in accordance with an embodiment of the present invention.

Referring to FIG. 2, the test signal providing circuits 160_0, 160_1, and 160_2 of the chips 112_0, 112_1, and 112_2 may include receivers RX3_0, RX3_1, and RX3_2, replica circuits 250_0, 250_1, and 250_2, and driving circuits 260_0, 260_1, and 260_2, respectively.

The receivers RX3_0, RX3_1, and RX3_2 may receive the test source signal TPDQS which is transferred through the first test through-electrode TSV_TDQS.

The replica circuits 250_0, 250_1, and 250_2 may generate the test signals REP_OUT_0, REP_OUT_1, and REP_OUT_2 by delaying the test source signal which is received by the receivers RX3_0, RX3_1, and RX3_2. The replica circuits 250_0, 250_1, and 250_2 may be designed by copying the delay values of the paths PATH_0, PATH_1, and PATH_2. The replica circuit 250_0 may be designed to have the same delay value as that of the path PATH_0, and the replica circuit 250_1 may be designed to have the same delay value as the path PATH_1. The replica circuit 250_2 may be designed to have the same delay value as that of the path PATH_2. Moreover, the delay amount between the test source signal TPDQS and the test signal REP_OUT_0 may be the same as the delay amount between the source signal PDQS and the preliminary signal A_0. Similarly, the delay amount between the test source signal TPDQS and the test signal REP_OUT_1 may be the same as the delay amount between the source signal PDQS and the preliminary signal A_1, and the delay amount between the test source signal TPDQS and the test signal REP_OUT_2 may be the same as the delay amount between the source signal PDQS and the preliminary signal A_2.

The driving circuits 260_0, 260_1, and 260_2 may transfer and receive the test signals REP_OUT_0, REP_OUT_1, and REP_OUT_2 to and from different chips. The driving circuit 260_0 may transfer the test signal REP_OUT_0 to the other chips 120_1 and 120_2 through the second test through-electrode TSV_TDQ0, and the driving circuit 260_1 may transfer the test signal REP_OUT_1 to the other chips 120_0 and 120_2 through the second test through-electrode TSV_TDQ1, and the driving circuit 260_2 may transfer the test signal REP_OUT_2 to the other chips 120_0 and 120_1 through the second test through-electrode TSV_TDQ2. Also, the driving circuits 260_0, 260_1, and 260_2 may receive the test signals REP_OUT_0, REP_OUT_1 and REP_OUT_2 that are loaded on the second test through-electrodes TSV_TDQ0, TSV_TDQ1, and TSV_TDQ2 and provide them to the calibration circuits 170_0, 170_1, and 170_2.

The transferors and receivers that are activated among the transferors and the receivers in the driving circuits 260_0, 260_1, and 260_2 are marked with block triangles. In consequences, the test signal REP_OUT_0 may be transferred as the signals SDQ0_0, SDQ0_1, and SDQ0_2, the test signal REP_OUT_1 may be transferred as the signals SDQ1_0, SDQ1_1, and SDQ1_2, and the test signal REP_OUT_2 may be transferred as the signals SDQ2_0, SDQ2_1, and SDQ2_2. That is, through the operation of the driving circuits 260_0, 260_1, and 260_2, the calibration circuits 170_0, 170_1, and 170_2 may receive not only the output signal of a replica circuit of the same chip but also the output signal of a replica circuit of the other chips.

Since the test signals REP_OUT_0, REP_OUT_1, and REP_OUT_2 of the chips 112_0, 112_1, and 112_2 are simultaneously transferred by the operation of the driving circuits 260_0, 260_1, and 260_2 to the calibration circuits 170_0, 170_1, and 170_2 of the chips 112_0, 112_1 and 112_2, the calibration circuits 170_0, 170_1, and 170_2 of the chips 112_0, 112_1 and 112_2 may simultaneously generate the calibration codes CAL_CODE_0<0:k>, CAL_CODE_1<0:k>, and CAL_CODE_2<0:k>. Since the operations for generating the calibration codes CAL_CODE_0<0:k>, CAL_CODE_1<0:k> and CAL_CODE_2<0:k> are performed in parallel, the calibration codes CAL_CODE_0<0:k>, CAL_CODE_1<0:k>, CAL_CODE_2<0:k>) may be quickly generated.

Figure 3:
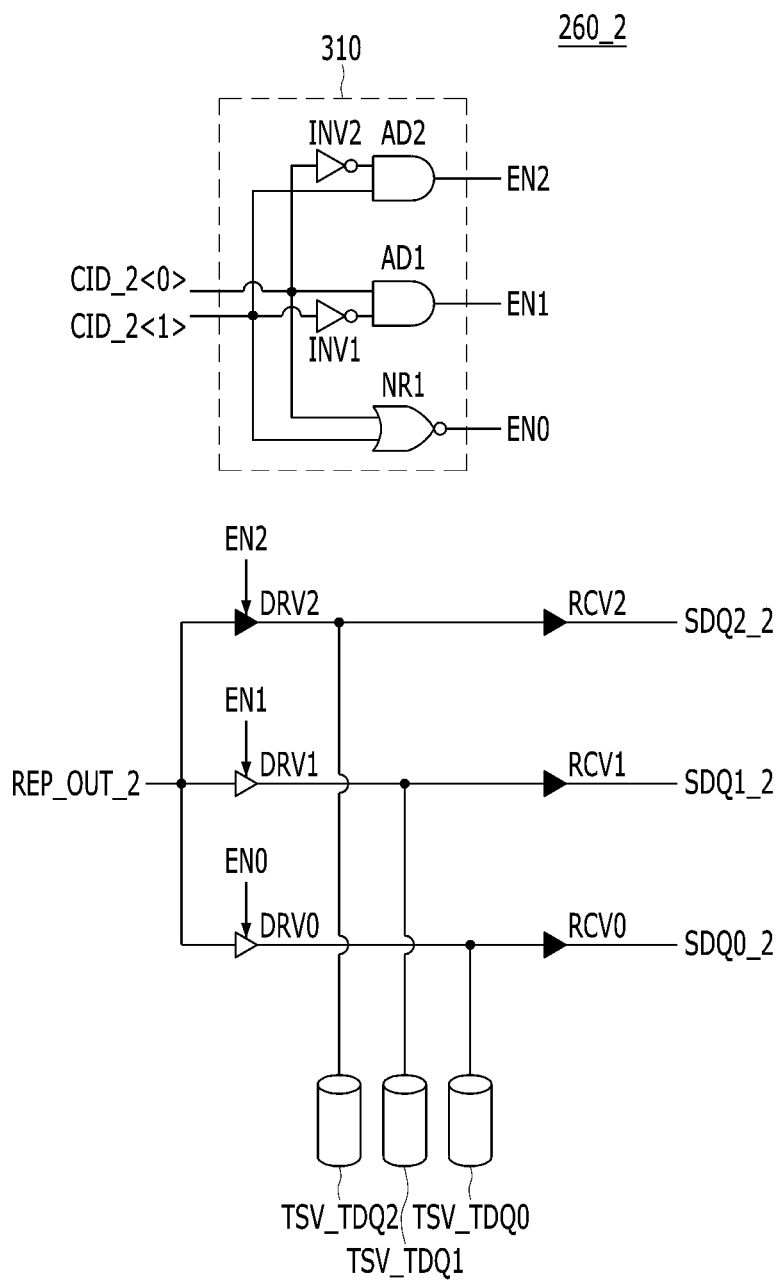
FIG. 3 is a detailed schematic diagram illustrating a driving circuit of a chip shown in FIG. 1 in accordance with an embodiment of the present invention.

FIG. 3 is a schematic diagram illustrating the driving circuit 260_2 of the chip 112_2 shown in FIG. 1 in detail in accordance with an embodiment of the present invention.

Referring to FIG. 3, the driving circuit 260_2 may include an activation control circuit 310, transferors DRV0, DRV1, and DRV2, and receivers RCV0, RCV1, and RCV2.

The activation control circuit 310 may decode the chip ID CID_2<0:1> to activate one of the driving enable signals EN0, EN1, and EN2. The activation control circuit 310 may include inverters INV1 and INV2, AND gates AD1 and AD2, and a NOA date NR1. The activation control circuit 310 may activate the driving enable signal EN0 when the chip ID CID_2<0:1> is '00', activate the driving enable signal EN1 when the chip ID CID_2<0:1> is '01', and activate the driving enable signal EN2 when the chip ID CID_2<0:1> is '10'. Since the chip ID CID_2<0:1> of the chip 112_2 is '10', the driving enable signal EN2 may be activated.

Since the driving enable signal EN2 is activated in the driving circuit 260_2 of the chip 112_2, the transferor DRV2 among the transferors DRV0, DRV1, and DRV2 may be activated to transfer the test signal REP_OUT_2 to the second test through-electrode TSV_TDQ2. The receivers RCV0, RCV1, and RCV2 may all be activated to receive signals from the second test through-electrodes RSV_TDQ0, TSV_TDQ1, and TSV_TDQ2 and transfer them to the calibration circuit 170_2.

In the driving circuit 260_0 of the chip 112_0, the driving enable signal EN0 may be activated to activate the transferor DRV0, and the transferor DRV0 may transfer the test signal REP_OUT_0 to the second test through-electrode TSV_TDQ0. Also, in the driving circuit 260_1 of the chip 112_1, the driving enable signal EN1 may be activated to activate the transferor DRV1, and the transferor DRV1 may transfer the test signal REP_OUT_1 to the second test through-electrode TSV_TDQ1.

Figure 4:
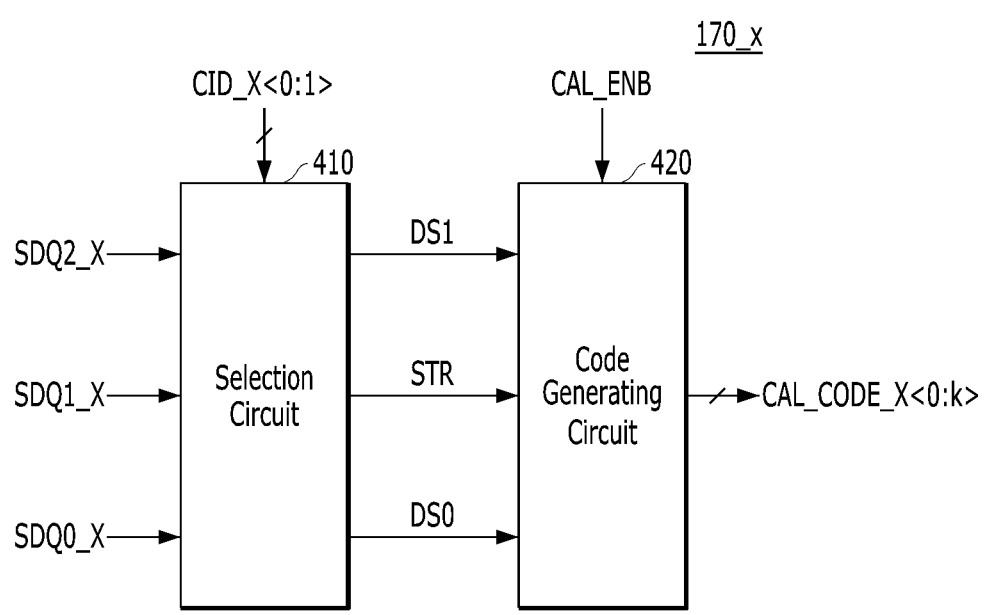
FIG. 4 is a block diagram illustrating a calibration circuit of FIG. 2 in accordance with an embodiment of the present invention.

FIG. 4 is a block diagram illustrating a calibration circuit 170_x of FIG. 2 in accordance with an embodiment of the present invention. Hereinafter, x may be one of 0, 1, and 2. That is, the calibration circuit 170_x may be one of the calibration circuits 170_0, 170_1 and 170_2.

Referring to FIG. 4, the calibration circuit 170_x may include a selection circuit 410 and a code generating circuit 420.

In each of the chips 120_0, 120_1 and 120_2, the selection circuit 410 may select one of the test signals SDQ0_x, SDQ1_x and SDQ2_x as a reference signal STR according to the chip ID CID_x<0:1>, and select the other test signals as detection signals DS0 and DS1. The selection circuit 410 may select, as the reference signal STR, a test signal of a chip including the selection circuit 410 and may select the test signals of the other chips as detection signals DS0 and DS1. For example, the selection circuit 410 of the chip 112_0 may select the test signal SDQ0_0 as the reference signal STR, and the selection circuit 410 of the chip 112_1 may select the test signal SDQ1_1 as the reference signal STR. The selection circuit 410 of the chip 112_2 may select the test signal SDQ2_2 as the reference signal STR.

The code generating circuit 420 may generate the calibration code CAL_CODE_x<0:k> based on the difference in the delay values between the reference signal STR and the detection signals DS0 and DS1.

Figures 5, 6:
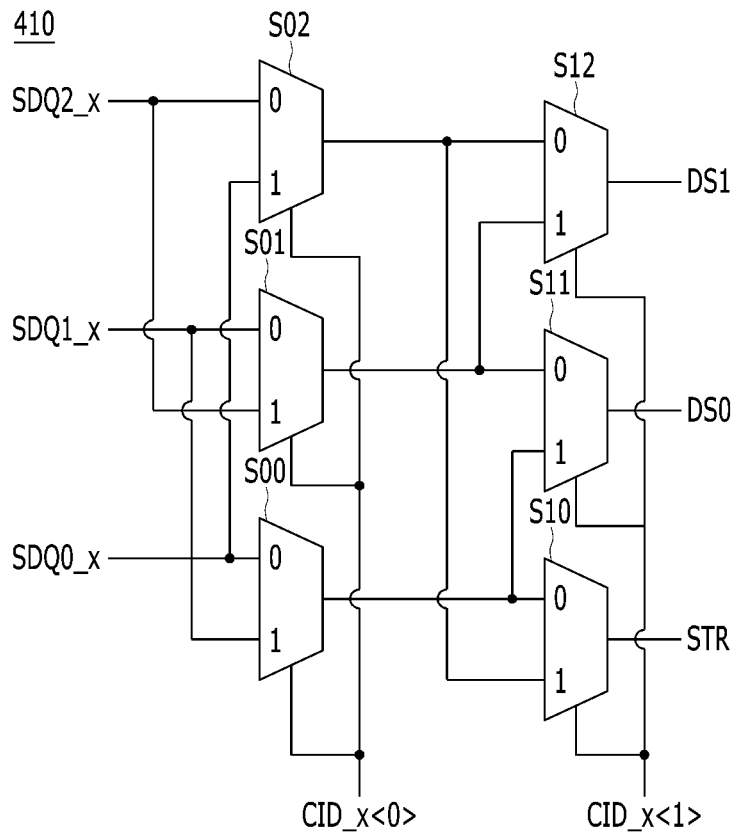
FIG. 5 is a schematic diagram illustrating a selection circuit of FIG. 4 in accordance with an embodiment of the present invention.
FIG. 6 is a table showing an operation of the selection circuit in accordance with an embodiment of the present invention.

FIG. 5 is a schematic diagram illustrating the selection circuit 410 of FIG. 4 in accordance with an embodiment of the present invention. FIG. 6 is a table showing an operation of the selection circuit 410 in accordance with an embodiment of the present invention.

Referring to FIG. 5, the selection circuit 410 may include multiplexers S00 to S12. The multiplexers S00 to S02 may be defined as upper multiplexers. The upper multiplexers S00 to S02 may select and output one of the test signals SDQ0_x, SDQ1_x and SDQ2_x based on a first bit CID_x<0> of the chip ID CID_x<0:1>. The multiplexers S10 to S12 may be defined as lower multiplexers. The lower multiplexers S10 to S12 may select one of the outputs of the upper multiplexers S00 to S02 based on a second bit CID_x<1> of the chip ID CID_x<0:1> and output the reference signal STR, the first detection signal DS0, and the second detection signal DS1, respectively.

To be specific, the multiplexer S00 may select one of the test signal SDQ0_x and the test signal SDQ1_x based on the first bit CID_x<0>. For example, the multiplexer S00 may select the test signal SDQ0_x when the first bit CID_x<0> is at a logic low level and select the test signal SDQ1_x when the first bit CID_x<0> is at a logic high level.

The multiplexer S01 may select one of the test signal SDQ1_x and the test signal SDQ2_x based on the first bit CID_x<0>. For example, the multiplexer S01 may select the test signal SDQ1_x when the first bit CID_x<0> is at a logic low level, and select the test signal SDQ2_x when the first bit CID_x<0> is at a logic high level.

The multiplexer S02 may select one of the test signal SDQ2_x and the test signal SDQ0_x based on the first bit CID_x<0>. For example, the multiplexer S02 may select the test signal SDQ2_x when the first bit CID_x<0> is at a logic low level, and select the test signal SDQ0_x when the first bit CID_x<0> is at a logic high level.

The multiplexer S10 may select one of the output of the multiplexer S00 and the output of the multiplexer S02 and output it as the reference signal STR based on the second bit CID_x<1>. For example, the multiplexer S10 may select the output of the multiplexer S00 when the second bit CID_x<1> is at a logic low level, and select the output of the multiplexer S02 when the second bit CID_x<1> is at a logic high level.

The multiplexer S11 may select one of the output of the multiplexer S01 and the output of the multiplexer S00 and output it as the detection signal DS0 based on the second bit CID_x<1>. For example, the multiplexer S11 may select the output of the multiplexer S01 when the second bit CID_x<1> is at a logic low level, and select the output of the multiplexer S00 when the second bit CID_x<1> is at a logic high level.

The multiplexer S12 may select one of the output of the multiplexer S02 and the output of the multiplexer S01 and output it as the detection signal DS1 based on the second bit CID_x<1>. For example, the multiplexer S12 may select the output of the multiplexer S02 when the second bit CID_x<1> is at a logic low level, and select the output of the multiplexer S01 when the second bit CID_x<1> is at a logic high level.

Referring to FIG. 6, when the chip ID signal CID_x<0:1> is "00", the selection circuit 272 of the chip 112_0 may select the test signal SDQ0_0 as the reference signal STR and output the test signal SDQ1_0 and the test signal SDQ2_0 as the detection signal DS0 and the detection signal DS1, respectively.

When the chip ID signal CID_x<0:1> is "01", the selection circuit 272 of the chip 112_1 may select the test signal SDQ1_1 as the reference signal STR, and output the test signal SDQ2_1 and the test signal SDQ0_1 as the detection signal DS0 and the detection signal DS1, respectively.

When the chip ID signal CID_x<0:1> is "10", the selection circuit 272 of the chip 112_2 may select the test signal SDQ2_2 as the reference signal STR and output the test signal SDQ0_2 and the test signal SDQ1_2 as the detection signal DS0 and the detection signal DS1, respectively.

Figure 7:
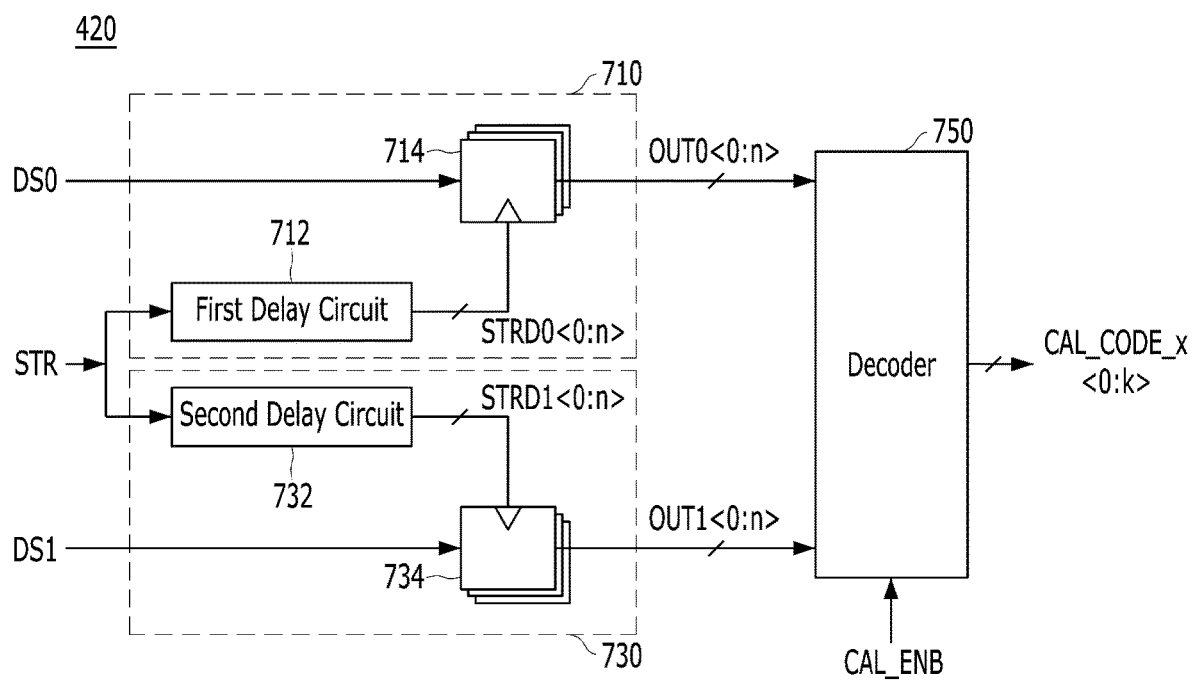
FIG. 7 is a block diagram illustrating a code generating circuit shown in FIG. 4 in accordance with an embodiment of the present invention.

FIG. 7 is a block diagram illustrating the code generating circuit 420 shown in FIG. 4 in accordance with an embodiment of the present invention.

Referring to FIG. 7, the code generating circuit 420 may include time digital converting circuits 710 and 730 and a decoder 750.

The first time-digital converting circuit 710 may generate a plurality of first delayed reference signals STRD0<0:n> by sequentially delaying the reference signal STR, and generate the first digital code OUT0<0:n> by performing a time-to-digital conversion (TDC) operation for triggering the detection signal DS0 based on the first delayed reference signals STRD0<0:n>. The second time-digital converting circuit 730 may generate a plurality of second delayed reference signals STRD1<0:n> by sequentially delaying the reference signal STR and generate the second digital code OUT1<0:n> by performing a time-to-digital conversion (TDC) operation for triggering the detection signal DS1 based on the second delayed reference signals STRD1<0:n>. The first digital code OUT0<0:n> may be a code corresponding to a delay amount between the reference signal STR and the detection signal DS0, and it may mean skew due to process variation between the chip that provides the reference signal STR and the chip that provides the detection signal DS0. Similarly, the second digital code OUT1<0:n> may be a code corresponding to a delay amount between the reference signal STR and the detection signal DS1, and it may mean skew due to process variation between the chip that provides the reference signal STR and the chip that provides the detection signal DS0.

For reference, the code generating circuit 420 may include a time-digital converting circuit corresponding to the number of detection signals, and the number of detection signals may vary according to the number of chips that are stacked in the semiconductor device 100.

The first time-digital converting circuit 710 may include a first delay circuit 712 and a first trigger circuit 714, and the second time-digital converting circuit 730 may include a second delay circuit 732 and a second trigger circuit 734. The second time-digital converting circuit 730 may have substantially the same structure as the first time-digital converting circuit 710. Detailed structure and operation of the first time-digital converting circuit 710 will be described with reference to FIGS. 8 to 10.

The decoder 750 may generate a calibration code CAL_CODE_x<0:k> based on the first digital code OUT0<0:n> and the second digital code OUT1<0:n>. For example, the decoder 750 may generate a delay code (which is TOUT<0:n> in FIG. 11) based on the first digital code OUT0<0:n> and the second digital code OUT1<0:n>, and may convert and output the generated delay code TOUT<0:n> into a calibration code CAL_CODE_x<0:k>, which is a binary code. A detailed structure and operation of the decoder 750 will be described with reference to FIGS. 11 to 13. The calibration end signal CAL_ENB may be used to fix a value of the calibration code CAL_CODE_x<0:k>. At the end of the calibration operation for generating the calibration code CAL_CODE_x<0:k>, the calibration end signal CAL_ENB may go to a logic high level. Here, the decoder 750 may fix the value of the calibration code CAL_CODE_x<0:k>.

Figure 8:
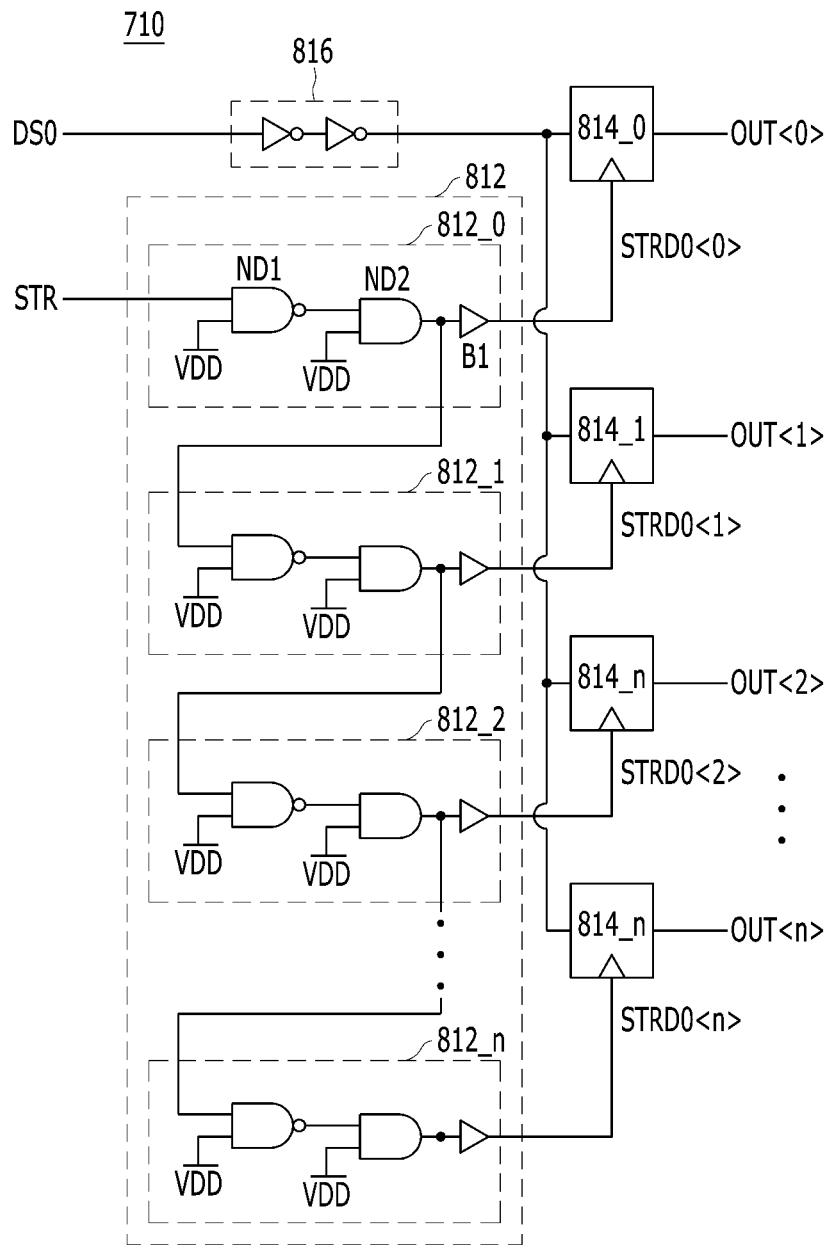
FIG. 8 is a schematic diagram illustrating a first time-digital converting circuit of FIG. 7 in accordance with an embodiment of the present invention.
Figure 9:
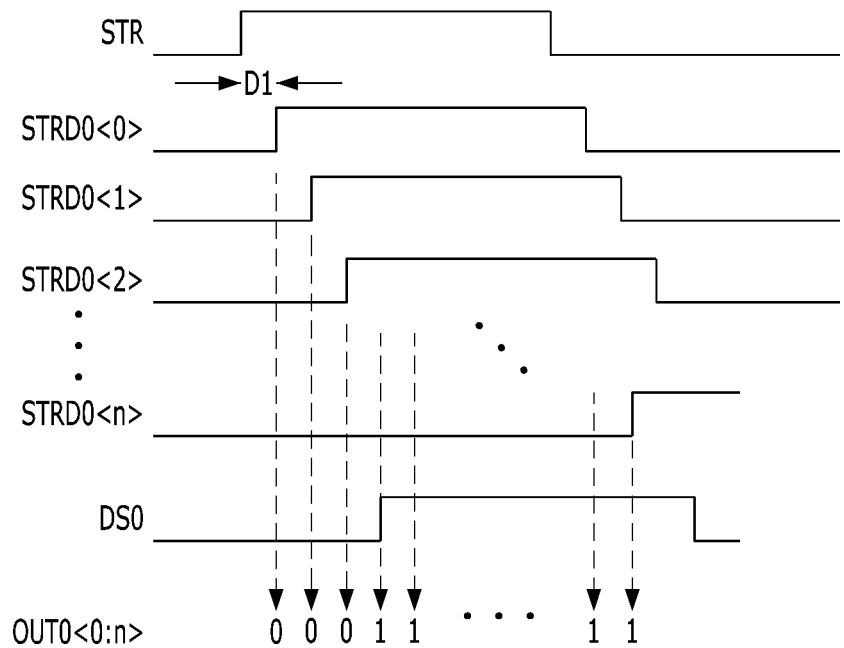
FIGS. 9 and 10 are timing diagrams illustrating an operation of the first time-digital converting circuit in accordance with an embodiment of the present invention.
Figure 10:
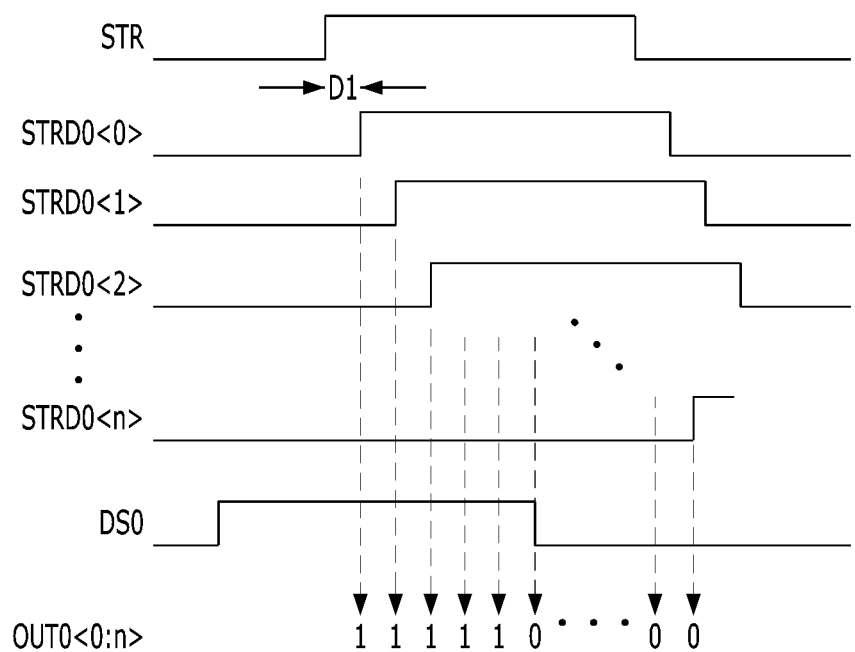

FIG. 8 is a schematic diagram illustrating the first time-digital converting circuit 710 of FIG. 7 in accordance with an embodiment of the present invention, and FIGS. 9 and 10 are timing diagrams illustrating an operation of the first time-digital converting circuit 710 in accordance with an embodiment of the present invention.

Referring to FIG. 8, the first delay circuit 712 may include a plurality of unit delayers 712_0 to 712_n. The unit delayers 712_0 to 712_n may generate a plurality of first delayed reference signals STRD0<0:n> by sequentially delaying the reference signal STR. The unit delayers 712_0 to 712_n may have the same structure. For example, the first unit delayer 712_0 may include cascaded first and second NAND gates ND1 and ND2 and a buffer B1. The first NAND gate ND1 may receive the reference signal STR and a power source voltage VDD, and the second NAND gate ND2 may receive the output of the first NAND gate ND1 and the power source voltage VDD. Accordingly, the first unit delayer 712_0 may generate the first delayed reference signal STRD0<0> by delaying the reference signal STR as much as the delay time D1 of the first and second NAND gates ND1 and ND2. Similarly, the second unit delayer 312_1 may generate the first delayed reference signal STRD0<1> by delaying the reference signal STR as much as the delay time D1*2. In this way, the first delay circuit 712 may generate the first delayed reference signals STRD0<0:n> by sequentially delaying the reference signal STR as much as the delay time D1, the delay time D1*2, . . . , delay time D1*(n+1).

The first trigger circuit 714 may generate the first digital code OUT0<0:n> by triggering the logic level of the detection signal DS0 in synchronization with a rising edge of the first delayed reference signals STRD0<0:n>. The first trigger circuit 714 may include a plurality of flip-flops 714_0 to 714_n that latch the first detection signal DS0 based on the first delayed reference signals STRD0<0:n> and output it as the first digital code OUT0<0:n>.

According to an embodiment of the present invention, the first time-digital converting circuit 710 may further include a buffer circuit 716 for buffering the detection signal DS0. The buffer circuit 716 may be provided to compensate for loading due to a plurality of flip-flops 714_0 to 714_n of the first trigger circuit 714, and may be realized as an even number of inverters that are coupled to each other in series.

With the above structure, the first time-digital converting circuit 710 may generate a plurality of first delayed reference signals STRD0<0:n> that are sequentially activated at an interval of a predetermined time D1 after a pulsing of the reference signal STR, and generate the first digital code OUT0<0:n> by triggering the logic level of the detection signal DS0 in synchronization with a rising edge of the first delayed reference signals STRD0<0:n>.

Referring to FIG. 9, a case where the reference signal STR pulses faster than the detection signal DS0 is illustrated. The first time-digital converting circuit 710 may output the bits of the corresponding first digital code OUT0<0:n> as low bits during a low section of the detection signal DS0, and output the bits of the corresponding first digital code OUT0<0:n> as high bits during a high section of the detection signal DS0. In this case, the most significant bit (MSB) of the first digital code OUT0<0:n> may be set as a low bit, and the number of low bits before the first high bit of the first digital code OUT0<0:n> (that is, before the high section of the detection signal DS0) may correspond to a delay value of the detection signal DS0 from the reference signal STR.

Referring to FIG. 10, a case where the detection signal DS0 pulses faster than the reference signal STR is illustrated. The first time-digital converting circuit 710 may output the bits of the corresponding first digital code OUT0<0:n> as high bits during a high section of the detection signal DS0, and output the bits of the corresponding first digital code OUT0<0:n> as low bits during a low section of the detection signal DS0. In this case, the MSB of the first digital code OUT0<0:n> may be set as a high bit, and the delay value of the detection signal DS0 from the reference signal STR may be zero "0").

Figure 11:
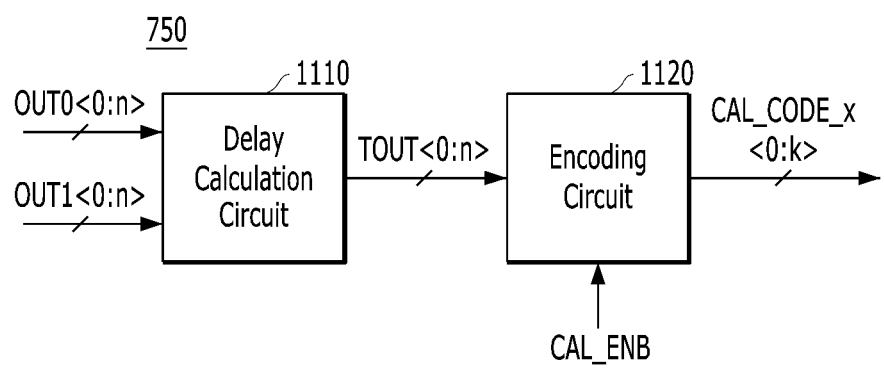
FIG. 11 is a block diagram illustrating a decoder of FIG. 7 in accordance with an embodiment of the present invention.
Figure 12:
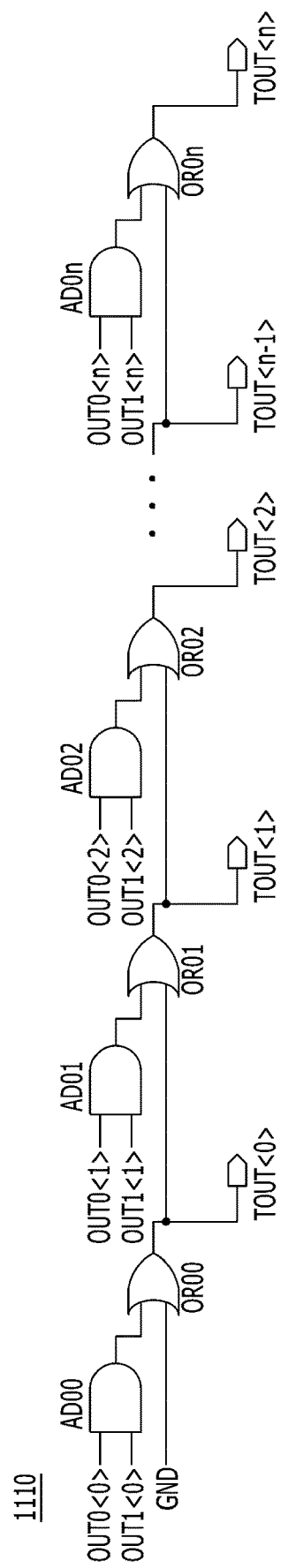
FIG. 12 is a schematic diagram illustrating a detailed structure of a delay calculation circuit shown in FIG. 11 in accordance with an embodiment of the present invention.

FIG. 11 is a block diagram illustrating the decoder 750 of FIG. 7 in accordance with an embodiment of the present invention. FIG. 12 is a schematic diagram illustrating a detailed structure of a delay calculation circuit 1110 shown in FIG. 11 in accordance with an embodiment of the present invention. FIG. 13 is a table explaining an operation of an encoding circuit 1120 shown in FIG. 11 in accordance with an embodiment of the present invention.

Referring to FIG. 11, the decoder 750 may include a delay calculation circuit 1110 and an encoding circuit 1120.

The delay calculation circuit 1110 may calculate the delay code TOUT<0:n> based on the first digital code OUT0<0:n> and the second digital code OUT1<0:n>. The delay calculation circuit 1110 may select a signal having a large delay amount with respect to the reference signal STR among the detection signals DS0 and DS1 based on the first digital code OUT0<0:n> and the second digital code OUT1<0:n>, and output a digital code corresponding to the selected detection signal as a delay code TOUT<0:n>. The delay code TOUT<0:n> may correspond to the larger delay value among the delay value of the detection signal DS0 from the reference signal STR and the delay value of the detection signal DS1 from the reference signal STR.

Referring to FIG. 12, the delay calculation circuit 1110 may include a plurality of AND gates AD00 to AD0n and a plurality of OR gates OR00 to OR0n.

The AND gates AD00 to AD0n and the OR gates OR00 to OR0n may correspond to the respective bits of the first digital code OUT0<0:n> and the second digital code OUT1<0:n>. The AND gates AD00 to AD0n may perform a logic AND operation on the corresponding bits of the first digital code OUT0<0:n> and the corresponding bits of the second digital code OUT1<0:n>. The OR gates OR00 to OR0n may perform a logic OR operation on the output of the corresponding AND gate and the output of the OR gate of the previous stage and output a delay code TOUT<0:n>. The OR gate OR00 of the first stage may receive the output of the corresponding AND gate AD00 and a ground voltage GND signal.

With the above structure, only when both of the bits of the first digital code OUT0<0:n> and the bits of the second digital code OUT1<0:n> are high bits, the delay calculation circuit 1110 may output the bits of the corresponding delay code TOUT<0:n> as high bits. When at least one among the bits of the first digital code OUT0<0:n> and the bits of the second digital code OUT1<0:n> is a low bit, the delay calculation circuit 1110 may determine the bits of the corresponding delay code TOUT<0:n> based on the lower bits of the delay code TOUT<0:n>. Also, when the lower bits of the delay code TOUT<0:n> are high bits, all of the upper bits of the delay code TOUT<0:n> may also be high bits. As a result, the delay calculation circuit 1110 may generate a thermometer code-type (i.e., unary code) delay code TOUT<0:n>.

For example, when the first digital code OUT0<0:n> of "00011111" and the second digital code OUT1<0:n> of "00000111" are input, the delay calculation circuit 1110 may generate a delay code TOUT<0:n> of "00000111" corresponding to the second digital code OUT1<0:n> having the large delay value. For example, when the first digital code OUT0<0:n> of "11100000" and the second digital code OUT1<0:n> of "00001111" are input, the delay calculation circuit 1110 may generate a delay code TOUT<0:n> of "00001111" corresponding to the second digital code OUT1<0:n> having the large value. For example, when the first digital code OUT0<0:n> of "11100000" and the second digital code OUT1<0:n> of "1100000" are input, the delay calculation circuit 1110 may generate a delay code TOUT<0:n> of "11111111" whose delay value corresponds to zero.

Referring back to FIG. 11, the encoding circuit 1120 may convert the delay code TOUT<0:n> into a calibration code CAL_CODE_x<0:k>, which is a binary code, and output the calibration code CAL_CODE_x<0:k>. When a calibration end signal CAL_ENB is at a logic high level, the encoding circuit may fix the value of the calibration code CAL_CODE_x<0:k>.

Referring to FIG. 13, a 4-bit calibration code CAL_CODE_x<0:3> according to an 8-bit delay code TOUT<0:7> is illustrated. Since the delay code TOUT<0:7> is of a thermometer code type, the 8-bit delay code TOUT<0:7> may have 9 cases. For example, when the delay code TOUT<0:

n>, which is all-high bits ("11111111"), is input, the encoding circuit 1120 may generate a preliminary calibration code PRE_CAL_CODE<0:k> having all-zero bits ("0000"), and as the number of low bits of the delay code TOUT<0:n> increases, the calibration code CAL_CODE_x<0:3> may be increased. Finally, when the delay code TOUT<0:n> of all-low bits ("00000000") is input, the encoding circuit 1120 may generate a 4-bit calibration code CAL_CODE_x<0:k> having the largest value "1000".

With the above structure, the encoding circuit 1120 may generate the calibration code CAL_CODE_x<0:k> to have a larger value as the number of low bits of the delay code TOUT<0:n> increases.

Figure 14:
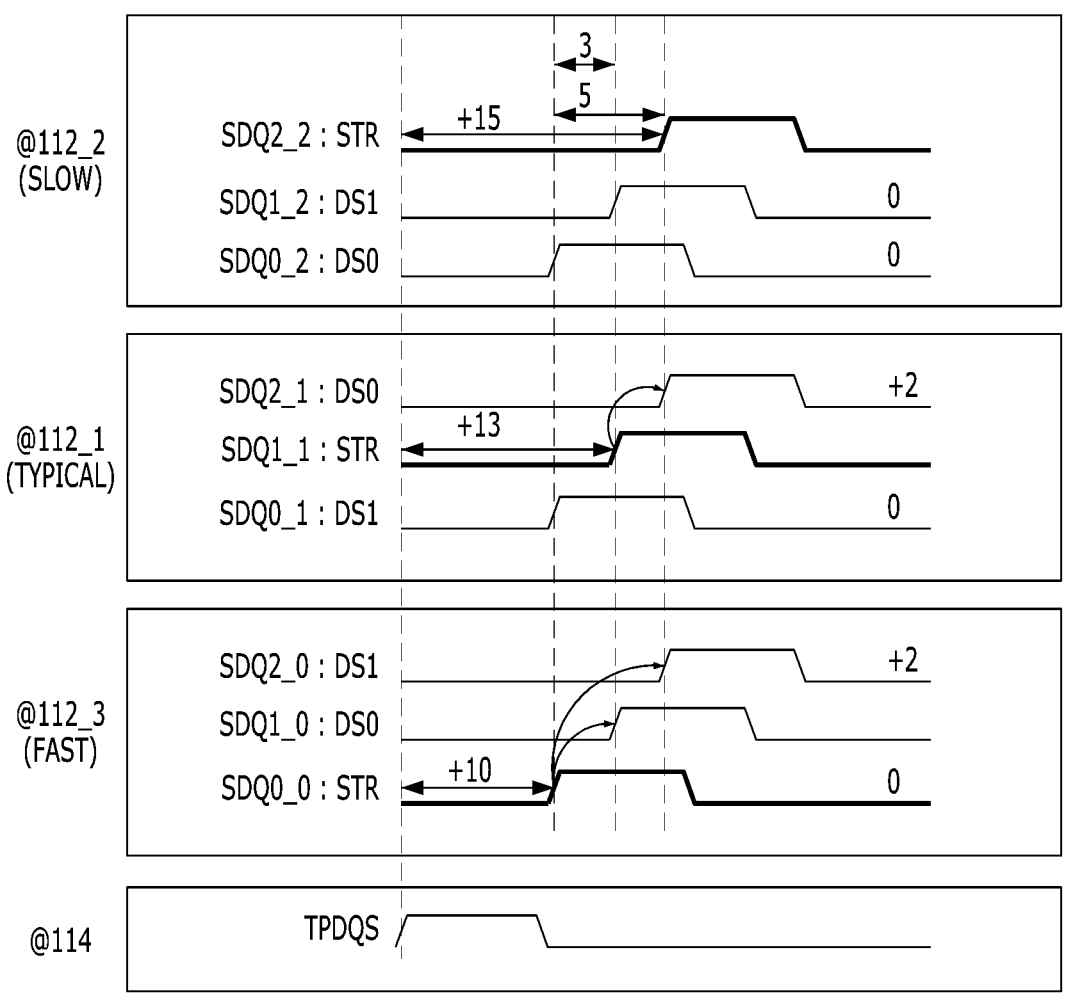
FIG. 14 is a timing diagram illustrating a calibration operation of the semiconductor device in accordance with an embodiment of the present invention.

FIG. 14 is a timing diagram illustrating a calibration operation of the semiconductor device 100 in accordance with an embodiment of the present invention.

Referring to FIG. 14, during a calibration operation, a test source signal TPDQS may be generated in the chip 114 and transferred to the first test through-electrode TSV_TDQS.

The replica circuits 250_0, 250_1, and 250_2 of the chips 112_0, 112_1, and 112_2 may delay and output the test source signal TPDQS by delay values of the paths PATH_0, PATH_1, and PATH_2. The test signals REP_OUT_0, REP_OUT_1, and REP_OUT_2 generated by the replica circuits 250_0, 250_1, and 250_2 may be provided to the chips 112_0, 112_1, and 112_2 through the driving circuits 260_0, 260_1, and 260_2. The test signals provided to the chip 112_0 are marked with SDQ0_0, SDQ1_0, and SDQ2_0, and the test signals provided to the chip 112_1 are marked with SDQ0_1, SDQ1_1, and SDQ2_1. The test signals provided to the chip 112_2 are marked with SDQ0_2, SDQ1_2, and SDQ2_2.

Herein, the operation characteristic of the chip 112_0 is FAST, the operation characteristic of the chip 112_1 is TYPICAL, the operation characteristic of the chip 112_2 is SLOW, the delay amount of the test signal SDQ0_0 generated in the chip 112_0 from the pulsing of the test source signal TPDQS is +10, the delay amount of the test signal SDQ1_1 generated in the chip 112_1 from the pulsing of the test source signal TPDQS is +13, and the delay amount of the test signal SDQ2_2 generated in the chip 112_2 from the pulsing of the test source signal TPDQS is +15.

The calibration circuit 170_0 of the chip 112_0 may select the test signal SDQ0_0 as the reference signal STR. The calibration circuit 170_0 may trigger the detection signal DS0 by using the first delayed reference signals STRD0<0:n> which are generated by sequentially delaying the selected reference signal STR to generate the first digital code OUT0<0:n>, and trigger the detection signal DS1 by using the second delayed reference signals STRD1<0:n> which are generated by sequentially delaying the selected reference signal STR to generate the second digital code OUT0<0:n>. The calibration circuit 170_0 may output the calibration code CAL_CODE_0<0:k> based on the first digital code OUT0<0:n> and the second digital code OUT1<0:n>.

Since the selected reference signal STR is faster than the detection signal DS0 by +3 and faster than the detection signal DS1 by +5, the calibration circuit 170_0 may generate the calibration code CAL_CODE_0<0:k> corresponding to the delay value of +5. Accordingly, during a read operation, the delay control circuit 150_0 of the chip 112_0 may delay the signal provided through the path PATH_0 by the delay value of +5 which corresponds to the calibration code CAL_CODE_0<0:k> to generate an internal strobe signal IDQS_0.

On the other hand, the calibration circuit 170_1 of the chip 112_1 may select the test signal SDQ1_1 as the reference signal STR. Since the selected reference signal STR is faster than the detection signal DS0 by +2 but slower than the detection signal DS1, the calibration circuit 170_1 may generate a calibration code CAL_CODE_1<0:k> which corresponds to the delay value of +2. Therefore, during a read operation, the delay control circuit 150_1 of the chip 112_1 may delay the signal provided through the path PATH_1 by the delay value of +2 which corresponds to the calibration code CAL_CODE_1<0:k> to generate an internal strobe signal IDQS_1.

The calibration circuit 170_2 of the chip 112_2 may select the test signal SDQ2_2 as the reference signal STR. Since the selected reference signal STR is slower than the detection signal DS0 and the detection signal DS1, the calibration circuit 170_2 may generate a calibration code CAL_CODE_2<0:k> which corresponds to the delay value of 0. Accordingly, during a read operation, the delay control circuit 150_2 of the chip 112_2 may generate the signal provided through the path PATH_2 as an internal strobe signal IDQS_2 without any delay.

Figure 15:
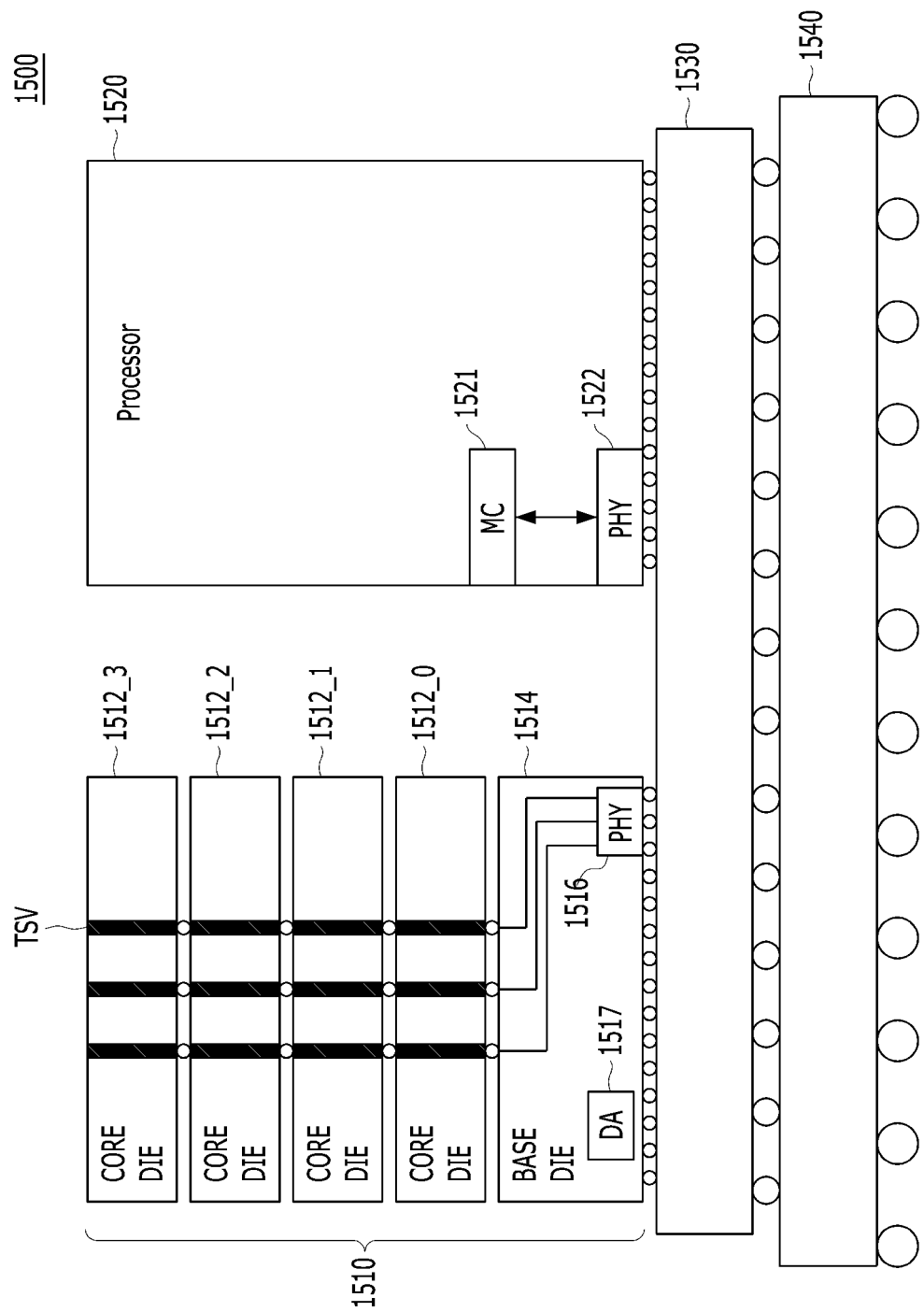
FIG. 15 is a block diagram illustrating a memory system in accordance with an embodiment of the present invention.

FIG. 15 is a block diagram illustrating a memory system 1500 in accordance with an embodiment of the present invention.

Referring to FIG. 15, the memory system 1500 may include a memory 1510 which is formed by stacking a plurality of chips 1514 and 1512_0 to 1512_3, a processor 1520, an interposer 1530, and a package substrate 1540.

The interposer 1530 may be formed over the package substrate 1540, and the memory 1510 and the processor 1520 may be formed over the interposer 1530.

The processor 1520 may include a memory controller 1521 and a PHY interface 1522 for an interface with the memory controller 1521. The PHY interface 1522 may be used by the memory controller 1521 to communicate with the memory 1510. The processor 1520 may be one among various processors, such as a Graphic Processing Unit (GPU), a Central Processing Unit (CPU), and an Application Processor (AP).

The memory 1510 may include a base die 1514 and core dies 1512_0 to 1512_3 that are stacked over the base die 1514. The chip 114 of the semiconductor device 100 described above may correspond to the base die 1514, and the chips 112_0, 112_1, and 112_2 may correspond to the core dies 1512_0 to 1512_3. The structures of FIG. 1 may be included in the base die 1514 and the core dies 1512_0 to 1512_3. An example of the memory 1510 formed by stacking a plurality of chips as described above may be a high bandwidth memory (HBM).

Each of the core dies 1512_0 to 1512_3 may include a cell array for storing data and circuits for writing data to and reading data from a cell array. The base die 1514 may include circuits for the interface between the core dies 1512_0 to 1512_3 and the base die 1514 and circuits for the interface between the base die 1514 and the memory controller 1521. The base die 1514 may also be referred to as a base die. A plurality of through silicon vias TSV may be formed between the stacked core dies 1512_0 to 1512_3, and through the through silicon vias TSV, commands, addresses and data may be transferred between the core dies 1512_0 to 1512_3 and the base die 1514.

The PHY interface 1516 of the base die 1514 may be an interface for communication between the base die 1514 and the memory controller 1521, and a direct access (DA) interface 1517 may be an interface for testing the memory 1510. The PHY interface 1516 may be coupled to the interposer 1530 through micro bumps, and the interposer 1530 may electrically connect the PHY interface 1516 of the base die 1514 to the PHY interface 1522 of the memory controller 1521 through internal interconnections (not shown). Further, the PHY interfaces 1516 and 1522 may be electrically connected to communicate each other through the interposer 1530. The PHY interface 1516 may be coupled to the interposer 1530 through more than 1000 micro bumps. Since the physical number of the micro bumps is very large, in reality, it is very difficult to test the memory 1510 BY using the PHY interface 1516. For this reason, the DA interface 1517 interfaced by using direct access pads whose number is relatively smaller than that of the micro bumps and whose physical size is relatively larger than those of the micro bumps may be used for testing the memory 1510.

The package substrate 1540 may include solder balls for supplying power to the memory 1510 and the processor 1520 and solder balls for the processor 1520 to communicate with the outside (e.g., other chips on a graphics card). The package substrate 1540 may be coupled to, for example, a graphic card.

According to the embodiments of the present invention, process variations may be reduced among a plurality of chips.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors exemplarily described in the above-described embodiment of the present disclosure should be realized differently depending on the polarity of the input signal. Furthermore, the embodiments may be combined to form additional embodiments.

What is claimed is:

1. A semiconductor device, comprising:
   a first transfer path suitable for receiving a source signal and outputting a first preliminary signal;
   a second transfer path suitable for receiving the source signal and outputting a second preliminary signal;
   a third transfer path suitable for receiving the source signal and outputting a third preliminary signal;
   a first calibration circuit suitable for generating a first calibration code corresponding to a difference in delay values between the first transfer path and a selected transfer path having a largest delay value among the first to third transfer paths;
   a second calibration circuit suitable for generating a second calibration code corresponding to a difference in delay values between the second transfer path and the selected transfer path;
   a third calibration circuit suitable for generating a third calibration code corresponding to a difference in delay values between the third transfer path and the selected transfer path;
   a first delay control circuit suitable for generating a first signal by delaying the first preliminary signal with a delay value which is determined based on the first calibration code;
   a second delay control circuit suitable for generating a second signal by delaying the second preliminary signal with a delay value which is determined based on the second calibration code; and
   a third delay control circuit suitable for generating a third signal by delaying the third preliminary signal with a delay value which is determined based on the third calibration code.

2. The semiconductor device of claim 1, further comprising:
   a first chip suitable for using the first signal as a strobe signal for outputting data of the first chip, and including the first transfer path, the first calibration circuit, and the first delay control circuit;
   a second chip suitable for using the second signal as a strobe signal for outputting data of the second chip, and including the second transfer path, the second calibration circuit, and the second delay control circuit; and
   a third chip suitable for using the third signal as a strobe signal for outputting data of the third chip, and including the third transfer path, the third calibration circuit, and the third delay control circuit.

3. The semiconductor device of claim 2, wherein the first chip, the second chip, and the third chip are stacked.

4. The semiconductor device of claim 2,
   wherein the first chip further includes:
      a first replica circuit suitable for simulating the delay value of the first transfer path and generating a first test signal by delaying a test source signal; and
      a first transferor suitable for transferring the first test signal to the second chip and the third chip, and
   wherein the second chip further includes:
      a second replica circuit suitable for simulating the delay value of the second transfer path and generating a second test signal by delaying the test source signal; and
      a second transferor suitable for transferring the second test signal to the first chip and the third chip, and
   wherein the third chip further includes:
      a third replica circuit suitable for simulating the delay value of the third transfer path and generating a third test signal by delaying the test source signal; and
      a third transferor suitable for transferring the third test signal to the first chip and the second chip.

5. The semiconductor device of claim 4,
   wherein the first calibration circuit includes:
      a first time-digital converting circuit suitable for generating a first digital code corresponding to a delay amount between the first test signal and the second test signal;
      a second time-digital converting circuit suitable for generating a second digital code corresponding to a delay amount between the first test signal and the third test signal; and
      a first decoder suitable for generating the first calibration code corresponding to a larger digital code among the first digital code and the second digital code, and
   wherein the second calibration circuit includes:
      a third time-digital converting circuit suitable for generating a third digital code corresponding to a delay amount between the second test signal and the first test signal;
      a fourth time-digital converting circuit suitable for generating a fourth digital code corresponding to a delay amount between the second test signal and the third test signal; and a second decoder suitable for generating the second calibration code corresponding to a larger digital code among the third digital code and the fourth digital code, and wherein the third calibration circuit includes:
a fifth time-digital converting circuit suitable for generating a fifth digital code corresponding to a delay amount between the third test signal and the first test signal;
a sixth time-digital converting circuit suitable for generating a sixth digital code corresponding to a delay amount between the third test signal and the second test signal; and
a third decoder suitable for generating the third calibration code corresponding to a larger digital code among the fifth digital code and the sixth digital code.

6. A semiconductor device comprising a plurality of stacked chips, to which different chip identifiers (IDs) are set, each chip including:
a transfer path suitable for transferring a source signal, which is transferred through a first normal through-electrode, and outputting a preliminary signal;
a delay control circuit suitable for generating an internal strobe signal by delaying the preliminary signal with a delay value which is determined based on a calibration code;
a replica circuit suitable for simulating a delay value of the transfer path and generating a test signal by delaying a test source signal which is transferred through a first test through-electrode;
a driving circuit suitable for transferring the generated test signal to a second test through-electrode corresponding to a chip ID among second test through-electrodes; and
a calibration circuit suitable for generating the calibration code based on the generated test signal and test signals transferred from the other chips through the second test through-electrodes.

7. The semiconductor device of claim 6, wherein each of the chips further includes a data output circuit suitable for outputting data of the chip to a second normal through-electrode based on the internal strobe signal.

8. The semiconductor device of claim 6,
further comprising a lower chip at a lower end of the chips,
wherein each of the chips further includes an ID allocation circuit suitable for generating a corresponding chip ID of the chip IDs based on an initial ID transferred from the lower chip.

9. The semiconductor device of claim 6, wherein the driving circuit includes:
a plurality of transferors suitable for driving the test signal to the second test through-electrodes in response to a plurality of driving enable signals; and
a plurality of receivers suitable for receiving the test signals transferred from the other chips through the second test through-electrodes and transferring the received test signals to the calibration circuit.

10. The semiconductor device of claim 9, wherein the driving circuit further includes an activation control circuit suitable for generating the driving enable signals by decoding the chip ID, and activating a driving enable signal corresponding to the chip ID among the driving enable signals.

11. The semiconductor device of claim 6, wherein the calibration circuit includes:
a selection circuit suitable for selecting, as a reference signal, one test signal among the test signals of the chips based on the chip ID and selecting the other test signals as detection signals; and
a code generating circuit suitable for generating the calibration code based on respective differences in delay values between the reference signal and the respective detection signals.

12. The semiconductor device of claim 11, wherein the selection circuit includes:
a plurality of upper multiplexers each suitable for selecting and outputting one test signal among the test signals based on a first bit of the chip ID; and
a plurality of lower multiplexers each suitable for selecting one output among outputs of the upper multiplexers based on a second bit of the chip ID and outputting the selected one as one of the reference signal and the detection signals.

13. The semiconductor device of claim 11, wherein the code generating circuit includes:
a plurality of time-digital converting circuits suitable for generating a plurality of delayed reference signals by sequentially delaying the reference signal, and generating a plurality of digital codes by performing a time-to-digital (TDC) operation for triggering the detection signals based on the delayed reference signals; and
a decoder suitable for generating a calibration code based on the digital codes.

14. The semiconductor device of claim 13, wherein each of the time-digital converting circuits includes:
a plurality of unit delays suitable for sequentially delaying the reference signal to generate the delayed reference signals; and
a plurality of flip-flops that latch corresponding detection signals according to the delayed reference signals and output the digital code.

15. The semiconductor device of claim 13, wherein the decoder includes:
a delay calculation circuit suitable for selecting a detection signal having a large delay amount with respect to the reference signal among the detection signals based on the digital codes and outputting a digital code corresponding to the selected detection signal as a delay code; and
an encoding circuit suitable for converting the delay code into the calibration code and outputting the calibration code.

16. The semiconductor device of claim 15, wherein the delay code is of a thermometer code type, and the calibration code is of a binary code type.

17. A semiconductor device comprising stacked chips each including:
an operation circuit configured to receive a source signal through a normal through-electrode to generate an internal strobe signal by delaying the source signal by a calibrated amount that depends on a calibration code;
a replica circuit configured to generate a test signal by delaying a test source signal, which is provided through a first test through-electrode, by an amount representing a delay other than the calibrated amount within the operation circuit;

a driving circuit configured to provide the test signal to remaining chips through a corresponding one of second test through-electrodes; and a calibration circuit configured to generate the calibration code by detecting respective delay amounts of external test signals, which are respectively provided from the remaining chips through remaining second test through-electrodes, with reference to the test signal.

* * * * *